(12) United States Patent
McCune, Jr.

(10) Patent No.: US 9,130,806 B2
(45) Date of Patent: *Sep. 8, 2015

(54) WIDEBAND PHASE MODULATION METHODS AND APPARATUS

(71) Applicant: Earl W. McCune, Jr., Santa Clara, CA (US)

(72) Inventor: Earl W. McCune, Jr., Santa Clara, CA (US)

(*) Notice: Subject to any disclaimer, the term of this patent is extended or adjusted under 35 U.S.C. 154(b) by 102 days.

This patent is subject to a terminal disclaimer.

(21) Appl. No.: 13/908,862

(22) Filed: Jun. 3, 2013

(65) Prior Publication Data

US 2013/0266089 A1    Oct. 10, 2013

Related U.S. Application Data

(63) Continuation of application No. 13/231,874, filed on Sep. 13, 2011, now Pat. No. 8,508,309.

(51) Int. Cl.
| | |
|---|---|
| *H03C 1/50* | (2006.01) |
| *H04L 27/20* | (2006.01) |
| *H03C 1/20* | (2006.01) |
| *H03C 1/60* | (2006.01) |
| *H03C 3/02* | (2006.01) |
| *H03C 5/00* | (2006.01) |

(52) U.S. Cl.
CPC *H04L 27/20* (2013.01); *H03C 1/20* (2013.01); *H03C 1/60* (2013.01); *H03C 3/02* (2013.01); *H03C 5/00* (2013.01)

(58) Field of Classification Search
CPC .............. H03C 1/20; H03C 1/60; H03C 3/02; H03C 5/00; H04L 27/20
USPC ........... 332/151; 375/308; 331/103, 144, 145, 331/149
See application file for complete search history.

(56) References Cited

U.S. PATENT DOCUMENTS

| | | | |
|---|---|---|---|
| 7,933,359 B2* | 4/2011 | Lee et al. ....................... | 375/308 |
| 8,508,309 B2* | 8/2013 | McCune, Jr. .................. | 332/103 |

* cited by examiner

*Primary Examiner* — Arnold Kinkead
(74) *Attorney, Agent, or Firm* — Patent Law Professionals, P.C.; William E. Winters

(57) ABSTRACT

A wideband phase modulator comprises a multiphase generator, a phase selector, and a phase adjuster. The wideband phase modulator is configured to receive an N-bit digital phase-modulating signal comprising a timed sequence of N-bit phase-modulating words, where N is a positive integer representing the bit resolution of the N-bit digital phase-modulating signal. The multiphase generator generates a plurality of coarse carrier phases, all having the same carrier frequency but each offset in phase relative to the other. The M most significant bits of the N-bit phase-modulating words are used to form M-bit phase select words that control the output phase of the phase selector. The phase adjuster performs a precision rotation operation, whereby a selected coarse carrier phase is adjusted so that the phase of the resulting final precision phase-modulated signal more closely aligns with a desired precision phase.

14 Claims, 13 Drawing Sheets

WIDEBAND PHASE MODULATION METHODS AND APPARATUS

CROSS-REFERENCE TO RELATED APPLICATIONS

This application is a continuation of U.S. patent application Ser. No. 13/231,874, filed on Sep. 13, 2011, the disclosure of which is incorporated herein by reference, in its entirety and for all purposes.

FIELD OF THE INVENTION

The present invention relates in general to communications transmitters. More particularly, the present invention relates to modulators and modulation methods for communications transmitters.

BACKGROUND OF THE INVENTION

Many modern communications standards such as, for example, WLAN (Wireless Local Area Network), LTE (Long Term Evolution) and WiMAX (Worldwide Interoperability for Microwave Access), require transmitters capable of generating wideband signals that also have high peak-to-average power ratios (PAPRs). Because a transmitter's energy consumption is determined in large part by how energy efficient its power amplifier (PA) is, it is desirable to employ a polar transmitter to transmit these high PAPR signals. Polar transmitters allow the use of highly efficient, nonlinear PAs, despite the high PAPR. However, they also require a wideband phase modulator.

Traditionally, phase modulators have been implemented within a phase-locked loop (PLL). As illustrated in FIG. 1, a PLL-based phase modulator 100 comprises a phase detector 102, a loop filter 104, a voltage-controlled oscillator (VCO) 106, and a combiner 108 through which a phase-modulating signal is "injected" into the loop. The phase detector 102 operates to compare the phase of the signal produced at the output of the VCO 106 to the phase of a reference signal of frequency $f_{REF}$ provided by a reference oscillator 110 and generate an error signal having a magnitude depending on the determined phase difference. The loop filter 104 performs a low-pass filtering function on the error signal, and the combiner 108 combines the phase-modulating signal with the filtered error signal, resulting in a combined phase-modulating signal which is applied to the control input of the VCO 106. Changes in signal phase introduced by the phase-modulating signal are therefore developed at the output of the VCO 106. Meanwhile, the PLL works continuously to reduce the phase difference between the resulting phase-modulated signal, which is fed back to the phase detector 102, and the reference signal provided by the reference oscillator 110.

One problem with the PLL-based phase modulator 100 is that low-frequency content in the phase-modulating signal that falls within the loop filter 104 bandwidth is compensated by the PLL and therefore not produced at the output of the VCO 106. This problem can be avoided by injecting the phase-modulating signal at the input of the reference oscillator 110, instead of at the input of the VCO 106. However, then, only the frequency content that is within the loop filter 104 bandwidth is produced at the output of the VCO 106. In other words, high-frequency modulation content tends to be filtered out. Because these two approaches produce complementary results, however, they can be beneficially combined, as illustrated in FIG. 2, resulting in what is known as a "two-point" phase modulator 200.

The two-point phase modulator 200 removes the dependency of the modulation bandwidth on the loop bandwidth of the PLL. However, the modulation bandwidth is still effectively limited by the bandwidth handling capability of the VCO 106. Many modern digital phase modulation schemes produce phase-modulating signals having abrupt phase changes (i.e., phase "shifts"), some even producing phase-modulating signals having complete 180 degree phase reversals. These types of signals contain very high frequency content. However, any practical VCO is capable of operating linearly only over a finite range of frequencies. Attempts to modulate the VCO beyond the linear range of operation can lead to substantial phase modulation errors.

High phase accuracy also requires that there be no significant gain or phase mismatch between the two modulation paths. This requirement can be difficult to satisfy, especially since the ability to match the two modulation paths depends on the modulation sensitivity of the VCO 106, which as explained above is not always a linear device.

A final problem with the two-point modulator 200 is that the reference oscillator 110 must be implemented as a VCO. In other words, two VCOs are needed. This requirement undesirably complicates the design and increases manufacturing costs.

Two-point phase modulators have been successfully implemented in GSM/EDGE (Global System for Mobile Communications/Enhanced Data Rates for GSM Evolution) and W-CDMA (Wideband Code Division Multiple Access) communications systems. However, because of the drawbacks and limitations discussed above, they have yet to be shown to be a suitable solution for WLAN, LTE, WiMAX and other developing wideband communications standards. It would be desirable, therefore, to have phase modulation methods and apparatuses that are capable of supporting WLAN, LTE, WiMAX and other wideband communications standards and at the same time are capable of providing the modulation resolution needed to satisfy the modulation accuracy requirements of these standards.

BRIEF SUMMARY OF THE INVENTION

Methods and apparatus for performing wideband phase modulation are disclosed. An exemplary wideband phase modulator comprises a multiphase generator, a phase selector, and a phase adjuster. The wideband phase modulator is configured to receive an N-bit digital phase-modulating signal comprising a timed sequence of N-bit phase-modulating words, where N is a positive integer representing the bit resolution of the N-bit digital phase-modulating signal. The multiphase generator generates a plurality of coarse carrier phases, all having the same carrier frequency but each offset in phase relative to the other. The M most significant bits of the N-bit phase-modulating words are used to form M-bit phase select words that control the output phase of the phase selector. The phase adjuster, which in one embodiment of the invention is implemented using a quadrature modulator, performs a precision rotation operation, whereby a selected coarse carrier phase is adjusted so that the phase of the resulting final precision phase-modulated signal more closely aligns with a desired precision phase.

The wideband phase modulation methods and apparatus of the present invention offer a number of advantages and benefits over prior art phase modulators. First, the coarse modulation function provided by the multiphase generator and phase selector is performed open loop, i.e., is not performed within a phase-locked loop (PLL). Hence, problems associated with having to contend with PLL loop bandwidth constraints are avoided. Second, the modulation process does not require modulating a voltage controlled oscillator by a phase-modulating signal having abrupt phase changes, as is required in some prior art phase modulators. All that is necessary to accomplish the coarse phase modulation function is to dynamically switch among the plurality of coarse carrier phases. Third, complications of having to match separate modulation paths, as is required in two-point phase modulators, are obviated. Finally, the wideband phase modulator is capable of performing wideband phase modulation at a precision limited only by the resolution of the N-bit phase modulating signal. This combined wideband/precision modulation capability allows the wideband phase modulation methods and apparatuses of the invention to support wideband requirements of WLAN, LTE, WiMAX and other wideband communications standards and at the same time satisfy the modulation accuracy requirements of such standards.

Further features and advantages of the invention, including descriptions of the structure and operation of the above-summarized and other exemplary embodiments of the invention, will now be described in detail with respect to accompanying drawings, in which like reference numbers are used to indicate identical or functionally similar elements.

DETAILED DESCRIPTION

Figure 3:
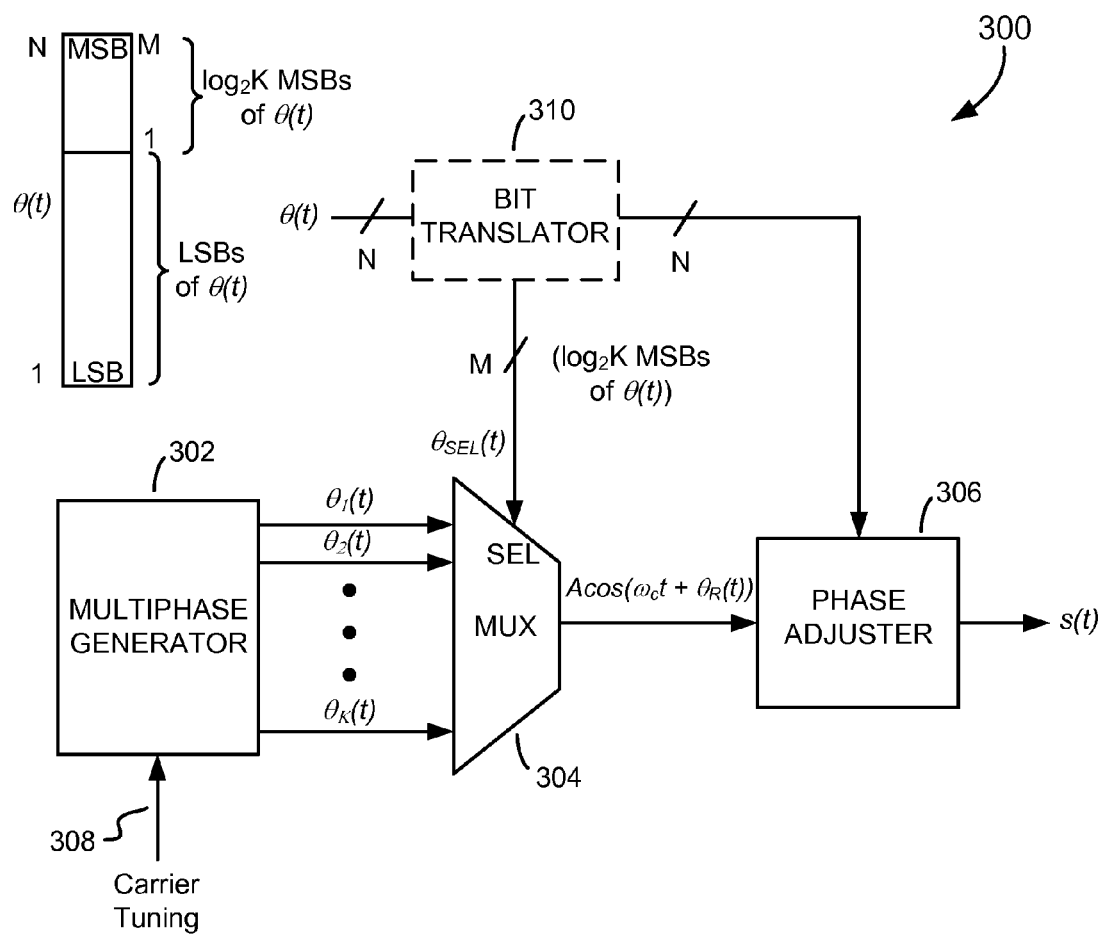
FIG. 3 is a drawing of a wideband phase modulator, according to an embodiment of the present invention.

Referring to FIG. 3, there is shown a wideband phase modulator 300, according to an embodiment of the present invention. The wideband phase modulator 300 comprises a multiphase generator 302, a phase selector 304, and a phase adjuster 306. As explained in detail below, the wideband phase modulator 300 generates a precision wideband phase-modulated signal $s(t)=A \cos(\omega_c t+\theta(t))$, where A is the signal amplitude, $\omega_c$ is the carrier frequency in radians/sec, and $\theta(t)$ is the phase modulation. The modulation bandwidth of the wideband phase modulator 300 is unrestricted by the loop bandwidth of any associated phase-locked loop (PLL), and provides a phase resolution at or above which is necessary to satisfy modulation accuracy requirements of modern wideband communications standards, such as WLAN, LTE and WiMAX.

As illustrated in FIG. 3, the wideband phase modulator 300 is configured to receive an N-bit digital phase-modulating signal $\theta(t)$ comprising a timed sequence of N-bit phase-modulating words, where N is a positive integer representing the bit resolution of the modulating words. The M most significant bits (MSBs) of the N-bit phase-modulating word are used to form an M-bit phase select signal $\theta_{SEL}(t)$ comprising a timed sequence of M-bit phase select words. The M-bit phase select signal $\theta_{SEL}(t)$ is applied to a select (SEL) input of the phase selector 304, which in the exemplary embodiment shown and described here comprises a K:1 multiplexer (MUX), where K is an integer representing the number of phases provided by the multiphase generator 302.

The multiphase generator 302 is configured to generate a plurality of (i.e., K) coarsely modulated carrier signals A $\cos(\omega_c t+\theta_1(t))$, A $\cos(\omega_c t+\theta_2(t))$, . . . , A $\cos(\omega_c t+\theta_K(t))$, all having the same amplitude A and carrier frequency $\omega_c$ but each offset in phase relative to the others. The phase offset between each two adjacent phases is preferably, though not necessarily, the same. Note that to ease illustration and description, the coarsely modulated signals A $\cos(\omega_c t+\theta_1(t))$, A $\cos(\omega_c t+\theta_2(t))$, . . . , A $\cos(\omega_c t+\theta_K(t))$ are also referred to in this disclosure, and shown in the drawings, as "coarse carrier phases" $\theta_1(t)$, $\theta_2(t)$, . . . , $\theta_K(t)$.

Depending on the application, the multiphase generator 302 may be configured so that the carrier frequency $\omega_c$ is fixed or is tunable, as indicated by the carrier tuning input 308 to the multiphase generator 302. Providing the ability to tune the carrier frequency $\omega_c$ is beneficial in that it allows the wideband phase modulator 300 to be used in communications transmitters that are tunable over a range of frequencies or between different frequency bands.

As alluded to above, together the multiphase generator 302 and phase selector 304 perform a coarse phase modulation function in which one of the K carrier signals (i.e., one of the coarse carrier phases $\theta_1(t), \theta_2(t), \ldots, \theta_K(t)$) generated by the multiphase generator 302 is selected at the output of the phase selector 304. The selected carrier signal $A \cos(\omega_c t + \theta_R(t))$ is also referred to herein as the "selected coarse carrier phase $\theta_R(t)$," where the "R" subscript in $\theta_R(t)$ is used to indicate that the selected carrier signal $A \cos(\omega_c t + \theta_R(t))$ is coarsely (i.e., roughly) modulated. (Note that the "R" subscript is used rather than a "C" subscript, in order to avoid confusion with the "C" subscript used in the carrier frequency $\omega_c$.)

Which of the coarse carrier phases $\theta_1(t), \theta_2(t) \ldots \theta_K(t)$ is selected at the output of the phase selector 304 depends on the values of the M-bit phase select words in the phase select signal $\theta_{SEL}(t)$, which as explained above is applied to the SEL input of the phase selector 304. In one embodiment of the invention, the phase selection (i.e., the coarse phase modulation) is performed at a symbol rate $1/T_S$, according to a symbol clock (not shown), where $T_S$ is the symbol duration (i.e., symbol period). For each symbol period $T_S$ and each M-bit phase select word applied to the phase selector 304, one of the K coarse carrier phases $\theta_1(t), \theta_2(t), \ldots, \theta_K(t)$ is selected, and for each two successive M-bit phase select words having different values, a phase transition (i.e., a phase "shift") is produced between successive symbols. The amount of phase shift is dependent on the specific modulation scheme used in forming the N-bit phase-modulating signal $\theta(t)$. For example, if the quadrature phase-shift keying (QPSK) modulation scheme was used, any one of phase shifts of 0, $+/-\pi/2$, or $\pi$ would be produced between successive symbols.

Figure 1:
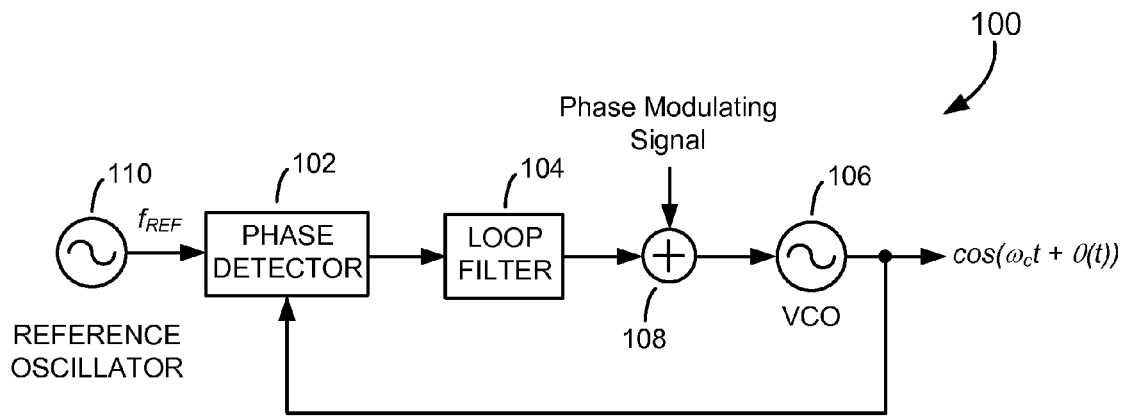
FIG. 1 is a drawing of a prior art phase-locked loop (PLL) in which phase modulation is performed within the PLL.
Figure 2:
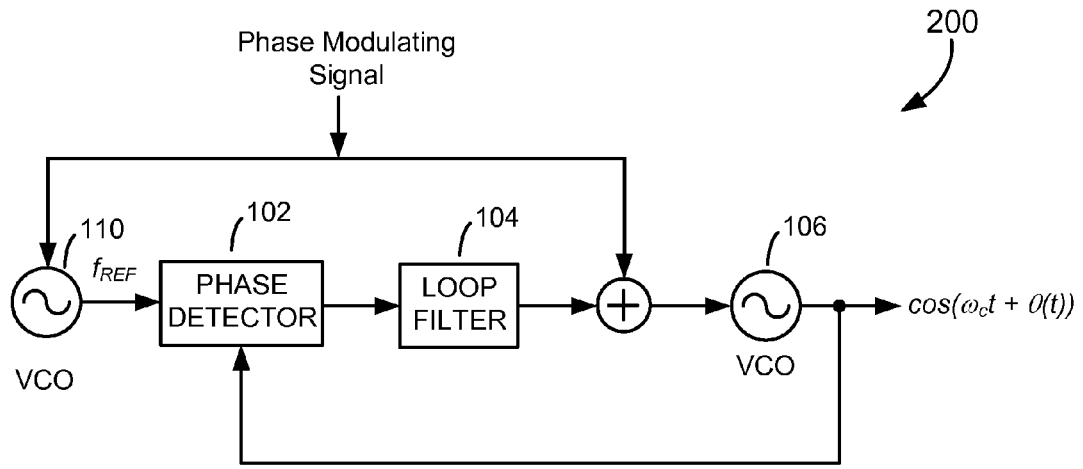
FIG. 2 is a drawing of a prior art two-point phase modulator.

One significant advantage of performing the coarse phase modulation using the multiphase generator 302 and phase selector 304 is that the modulation is performed open loop, i.e., is not performed within a PLL. Hence, the problems of having to contend with PLL loop bandwidth constraints are avoided. Moreover, the modulation process does not require modulating a VCO by a phase-modulating signal having abrupt phase changes, as is required in the prior art phase modulators 100 and 200 shown and described in FIGS. 1 and 2 above. All that is necessary to accomplish the coarse phase modulation function is to dynamically switch among the multiple coarse carrier phases $\theta_1(t), \theta_2(t), \ldots, \theta_K(t)$ according to the M-bit phase select words.

The selected coarse carrier phase $\theta_R(t)$ has a phase resolution that is limited by the number of phases K the multiphase generator 302 is capable of generating. State-of-the-art multiphase generators are capable of accurately generating up to only about K=64 different phases per cycle. In other words, they have a phase resolution of up to only about $M = \log_2 64 = 6$ bits. However, some modern communications standards require a significantly higher phase resolution, for example 10 bits or higher. According to one aspect of the invention, higher phase resolution is realized using the phase adjuster 306. The phase adjuster 306, which may be implemented in hardware or combination of software and hardware, is configured to receive the full N bits of each N-bit phase-modulating word and adjust the phase of each symbol in the selected coarse carrier phase $\theta_R(t)$ accordingly, so that the phase of each symbol in the final phase-modulated signal $s(t) = A \cos(\omega_c t + \theta_P(t))$ more closely matches the desired precision phase $\theta_P(t)$. In other words, the phase adjuster 306 performs a fine phase adjustment (i.e., interpolating) function between adjacent coarse phases to achieve the desired N-bit precision phase resolution.

Figure 4:
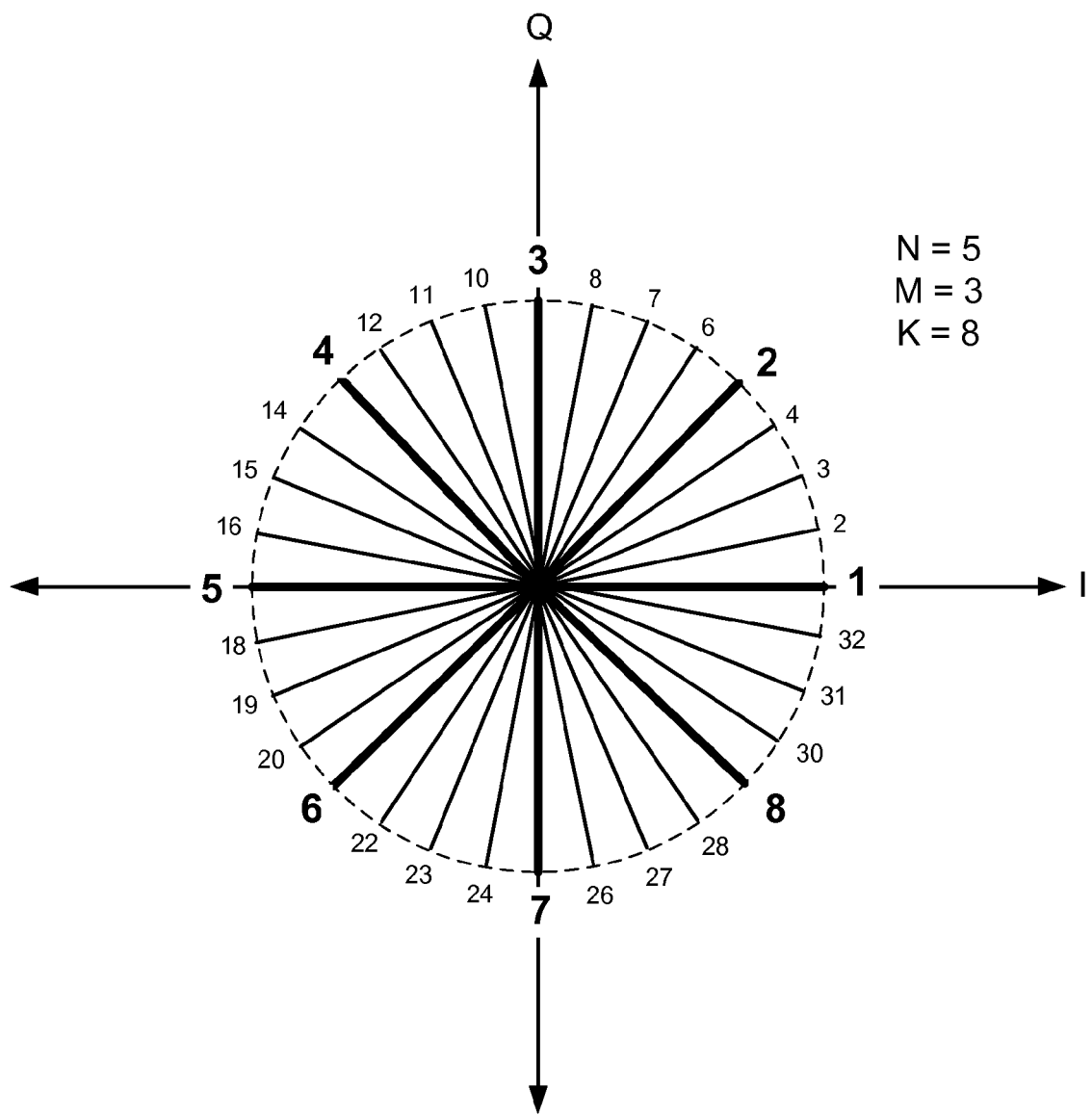
FIG. 4 is a phasor diagram illustrating the phase relationships among the coarse and precision phases of the wideband phase modulator in FIG. 3.

FIG. 4 is a phasor diagram illustrating the phase relationships among the K possible coarse carrier phases $\theta_1(t), \theta_2(t), \ldots, \theta_K(t)$ and the $2^N$ possible precision phases $\theta_P$ of the final phase-modulated signal $A \cos(\omega_c t + \theta_P(t))$ for an N=5 bit input phase-modulating signal $\theta(t)$, a multiphase generator 302 configured to provide K=8 coarse carrier phases $\theta_1(t), \theta_2(t), \ldots, \theta_8(t)$, and a phase adjuster 306 that produces $2^N/K = 32/8 = 4$ precision phases $\theta_P$ between each two adjacent coarse carrier phases. Note that in this example the wideband phase modulator 300 provides only five bits of total phase resolution. However, this is only an example and the wideband phase modulator 300 can be alternatively configured to have a higher resolution. For example, in one particular implementation of the invention, the N-bit input phase-modulating signal $\theta(t)$ has a bit resolution of N=10 bits, the multiphase generator 302 is configured to provide K=64 coarse carrier phases $\theta_1(t), \theta_2(t), \ldots, \theta_{64}(t)$, and the phase adjuster 306 produces $2^N/K = 1024/64 = 16$ precision phases $\theta_P$ between each two of the K=64 coarse carrier phases.

In the exemplary embodiment of the invention described above, only the M-most MSBs of the N-bit phase-modulating words are used in selecting the coarse carrier phase $\theta_R(t)$. This results in the coarse carrier phase $\theta_R(t)$ always lagging the desired precision phase $\theta_P(t)$ and the fine phase adjustment operation of the phase adjuster 306 being performed only in a one angular direction (i.e., positive rotation). In other words, the fine phase adjustment operation is what may be referred to as "one-sided." In other embodiments of the invention, the phase adjuster 306 is alternatively configured to perform a "two-sided" fine phase adjustment operation, whereby the selected coarse carrier phase $\theta_R(t)$ is rotated negatively or positively, depending on whether the selected coarse carrier phase $\theta_R(t)$ leads or lags the desired precision phase $\theta_P(t)$. In other words, instead of performing fine phase adjustment "between" a selected coarse carrier phase $\theta_R(t)$ and the next positive coarse carrier phase (as in the exemplary embodiment described above), the fine phase adjustment is performed "around" a coarse carrier phase determined to be closest in phase to the desired precision phase $\theta_P(t)$. Once the selected coarse carrier phase $\theta_R(t)$ is selected according to this approach, the phase adjuster 306 then finely adjusts around the selected coarse carrier phase $\theta_R(t)$ (positive or negative rotation) so that the phase of the final phase-modulated signal $s(t)$ more closely matches the desired precision phase $\theta_P(t)$. To support this alternative embodiment, a bit translator 310 is configured between the input for the N-bit phase-modulating signal $\theta(t)$ and the SEL input of the phase selector 304. The bit translator 310 is operable to translate MSBs of the incoming N-bit words to M-bit phase select words having values needed to select the coarse carrier phase determined to be closest to the desired precision phase $\theta_P(t)$. Like the other functional elements of the wideband phase modulator 300, the functions performed by the bit translator 310 may be implemented using dedicated hardware (e.g., logic circuitry) or may be performed by an associated digital signal processor in accordance with software instructions.

Figure 5:
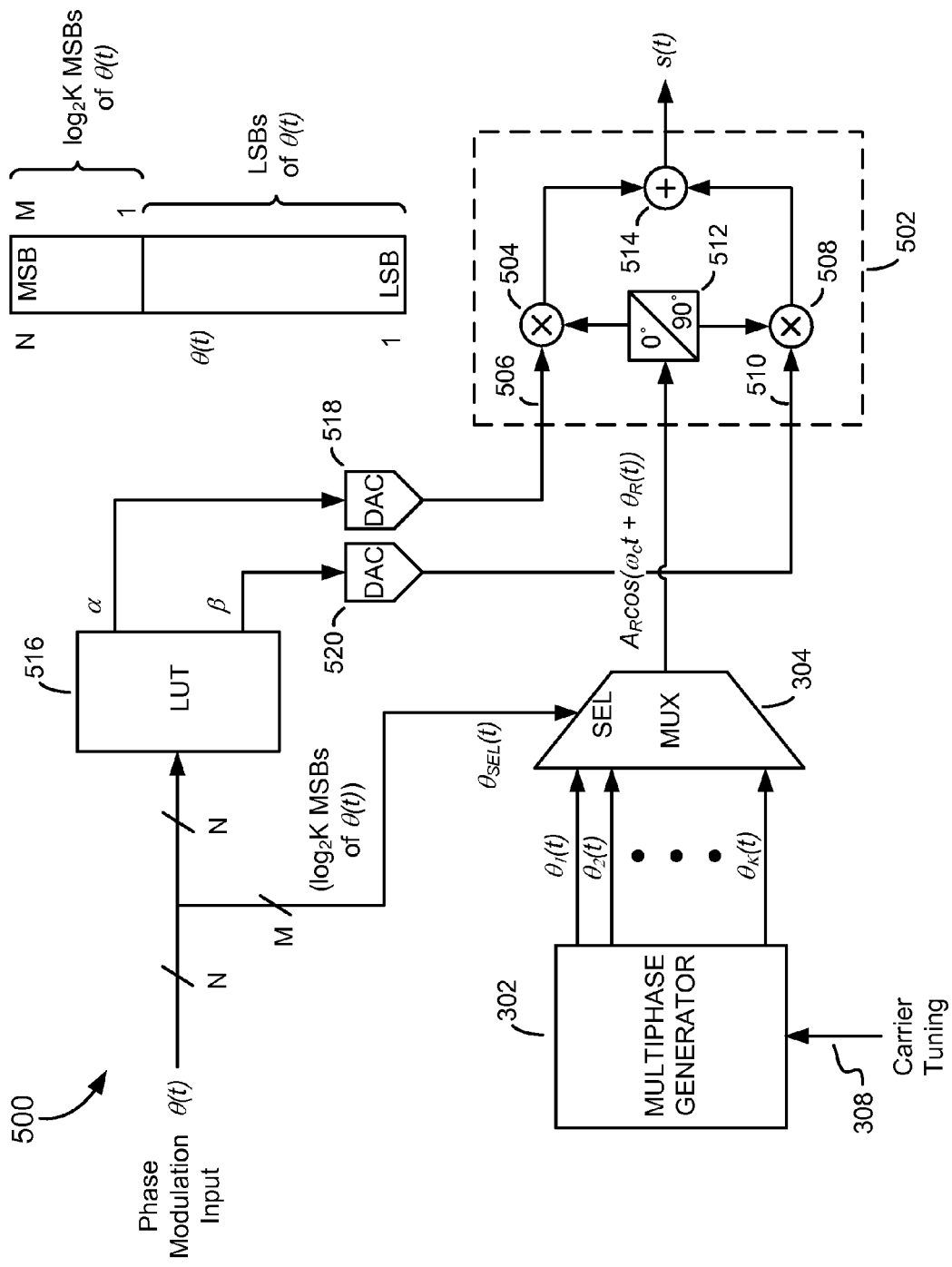
FIG. 5 is a drawing of a wideband phase modulator, illustrating how the phase adjuster of the wideband phase modulator in FIG. 3 may be implemented using a quadrature modulator, according to an embodiment of the present invention.
Figure 6:
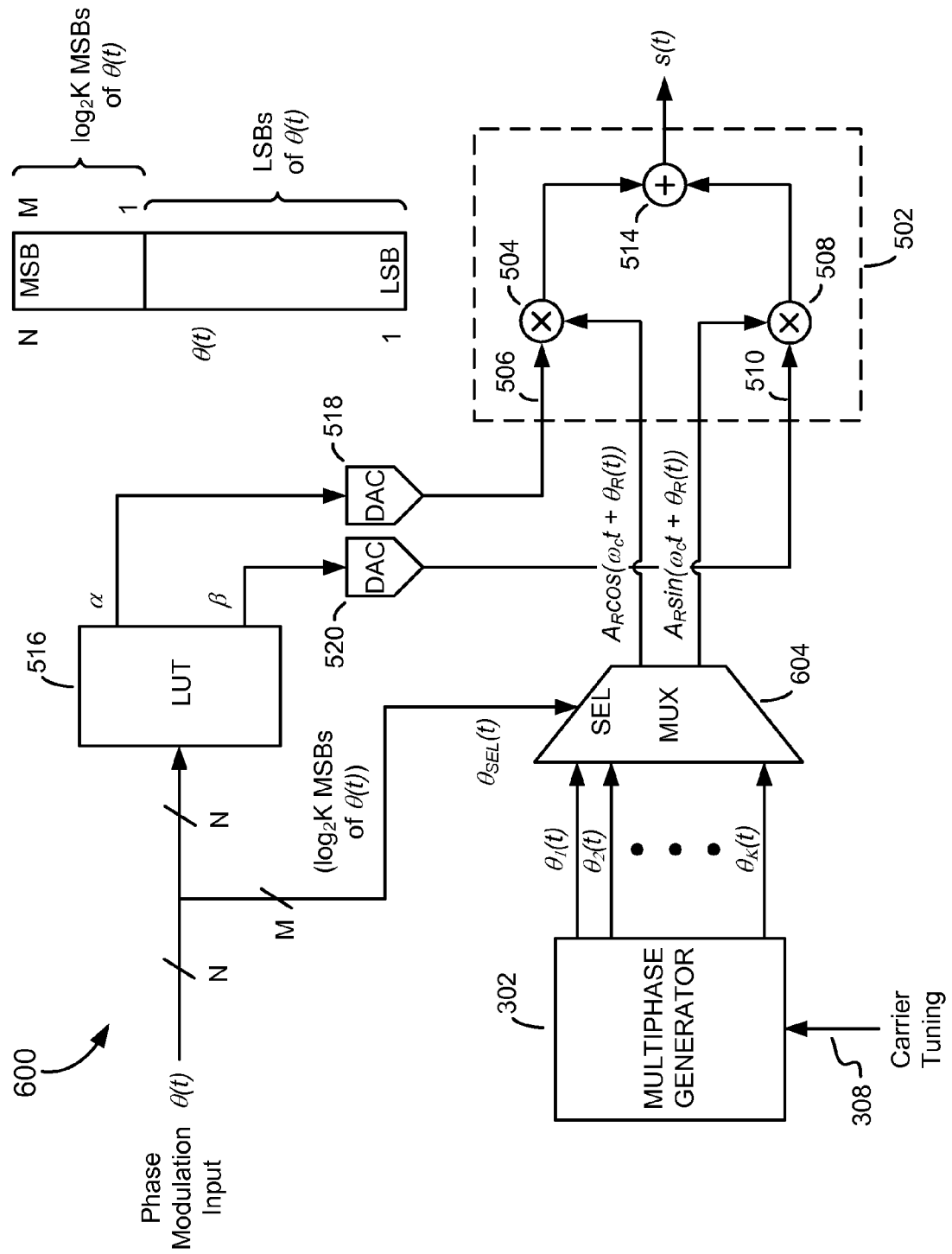
FIG. 6 is a drawing of a wideband phase modulator, similar to the wideband phase modulator shown in FIG. 5, but using a differential phase selector to remove the need of the quadrature phase splitter of the quadrature modulator, according to an embodiment of the present invention.

According to one embodiment of the invention, illustrated in FIG. 5, the phase adjuster 304 is implemented using a quadrature modulator (QM) 502. As will be readily understood by those of ordinary skill in the art, the QM 502 comprises an in-phase mixer 504 disposed in an in-phase arm 506, a quadrature mixer 508 disposed in a quadrature arm 510, a quadrature phase splitter 512, and a combiner 514. The selected coarse phase-modulated signal $A \cos(\omega_c t + \theta_R(t))$ is applied to the input of the quadrature phase splitter 512, so that, in effect, the multiphase generator 302 and phase selector 304 together serve as a local oscillator for the QM 502. The quadrature phase splitter 512 is configured to generate in-phase and quadrature components $I_R(t)$ and $Q_R(t)$ of the coarse phase-modulated signal $A \cos(\omega_c t + \theta_R(t))$. (Note that for multiphase generators having multiphase oscillators capable of generating multiple differential in-phase and quadrature outputs, such as the multiphase oscillators described later in FIGS. 11 and 13, a differential phase selector 604 having a differential in-phase and quadrature output may be used, instead of a phase selector 304 having a single-ended output), to provide the in-phase and quadrature components $I_R(t)$ and $Q_R(t)$ directly, thereby removing the need for the quadrature phase splitter 512. An embodiment of the invention utilizing this approach is shown in FIG. 6.)

After the in-phase and quadrature components $I_R(t)$ and $Q_R(t)$ have been generated, they are applied to first inputs of the in-phase and quadrature mixers 504 and 508. As the in-phase and quadrature components $I_R(t)$ and $Q_R(t)$ are applied to the quadrature phase splitter 506, in-phase and quadrature phase adjustment coefficients $\alpha$ and $\beta$ configured in a lookup table (LUT) 516 and stored in a memory device (e.g., random access memory (RAM), read only memory (ROM), or flash memory) are retrieved from the LUT 516 based on the values of the incoming N-bit modulating words (or, alternatively, computed on the fly by an associated digital signal processor and controlling software program), converted to analog phase adjustment coefficients by digital-to-analog converters (DACs) 518 and 520, and applied to second inputs of the in-phase and quadrature mixers 504 and 508. (It should be noted that the QM 502 in this exemplary embodiment of the invention and the QM in other illustrated embodiments of the invention comprise analog QMs having analog in-phase and quadrature mixers 504 and 508. However, the QMs may alternatively comprise digital QMs having digital in-phase and quadrature mixers, in which case the in-phase and quadrature components $I_R(t)$ and $Q_R(t)$ of the coarse phase-modulated signal $A \cos(\omega_c t + \theta_R(t))$ would be converted to the digital domain prior to being applied to the digital in-phase and quadrature mixers.)

Figure 7:
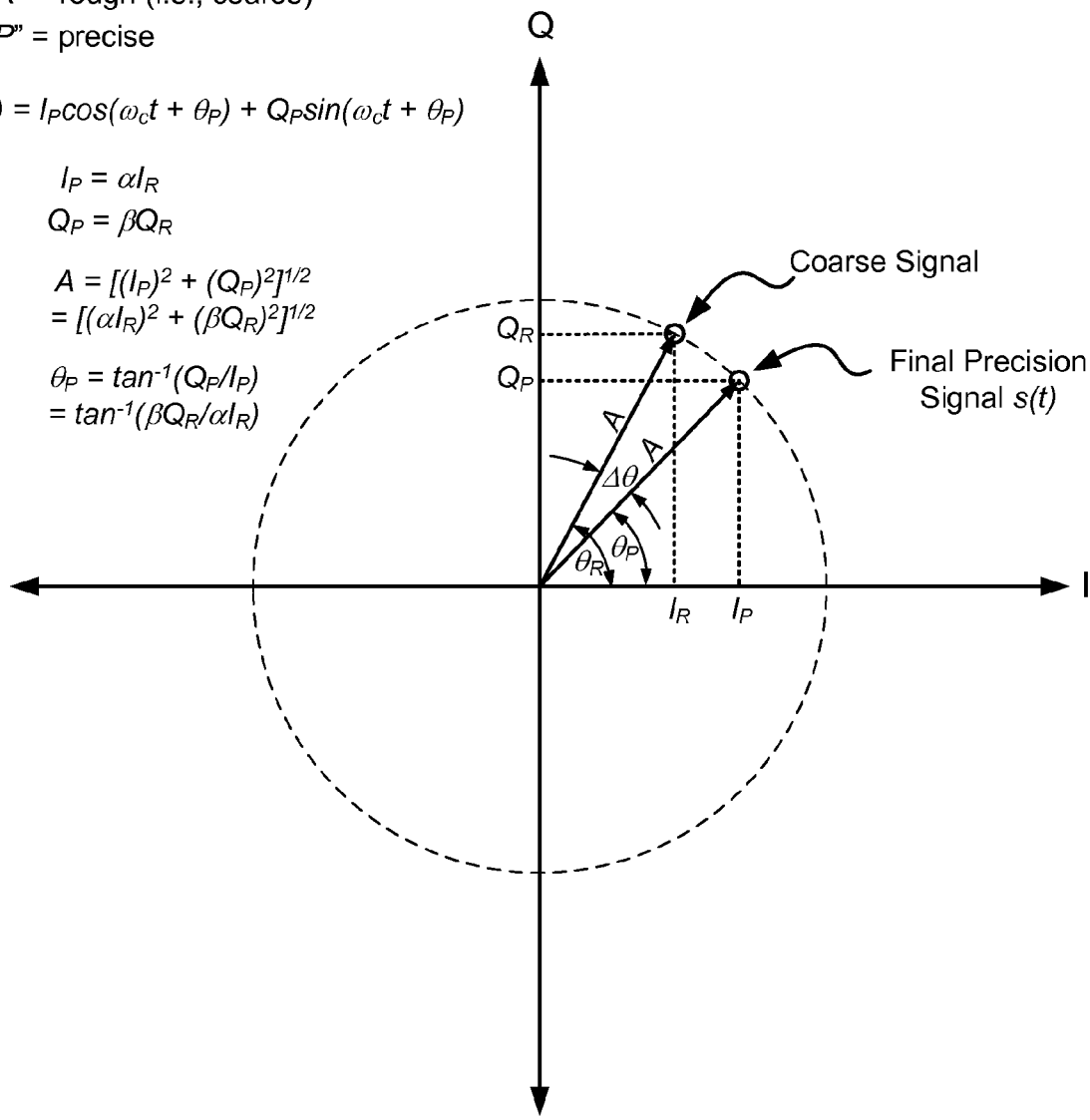
FIG. 7 is a phasor diagram showing the phase relationship between a coarse carrier phase and a precision carrier phase for coarse and precision carrier phases having the same magnitude.

The in-phase and quadrature mixers 504 and 508 are configured to multiply (i.e., scale) the in-phase and quadrature components $I_R(t)$ and $Q_R(t)$ by the analog phase adjustment coefficients, thereby producing scaled (i.e., precision) in-phase and quadrature components $I_P(t) = \alpha I_R(t)$ and $Q_P(t) = \beta Q_R(t)$. The scaled in-phase and quadrature components $I_P(t) = \alpha I_R(t)$ and $Q_P(t) = \beta Q_R(t)$ are then finally combined by the combiner 514 to produce the desired precision phase-modulated signal $s(t) = I_P(t)\cos(\omega_c t + \theta_P(t)) + Q_P(t)\sin(\omega_c t + \theta_P(t))$. Hence, in effect, and as illustrated in the phasor diagram in FIG. 7, the QM 502 performs a precision phase rotation (i.e., phase interpolation) function, whereby for each symbol the coarse phase-modulated signal $A \cos(\omega_c t + \theta_R(t))$ is finely rotated, depending on the values of $\alpha$ and $\beta$ retrieved from the LUT 516, so that the phase of the final precision phase-modulated signal s(t) more closely aligns with the desired precision phase $\theta_P$. By performing the coarse modulation first, the QM 502 is not required to perform a wideband modulation function itself. It only needs to perform the fine phase rotation (i.e., phase interpolation) function between two coarse phases. The effective phase resolution of the wideband phase modulator 300 is therefore enhanced to N-bits without disturbing the modulator's 300's overall wideband modulation capability.

Figure 8:
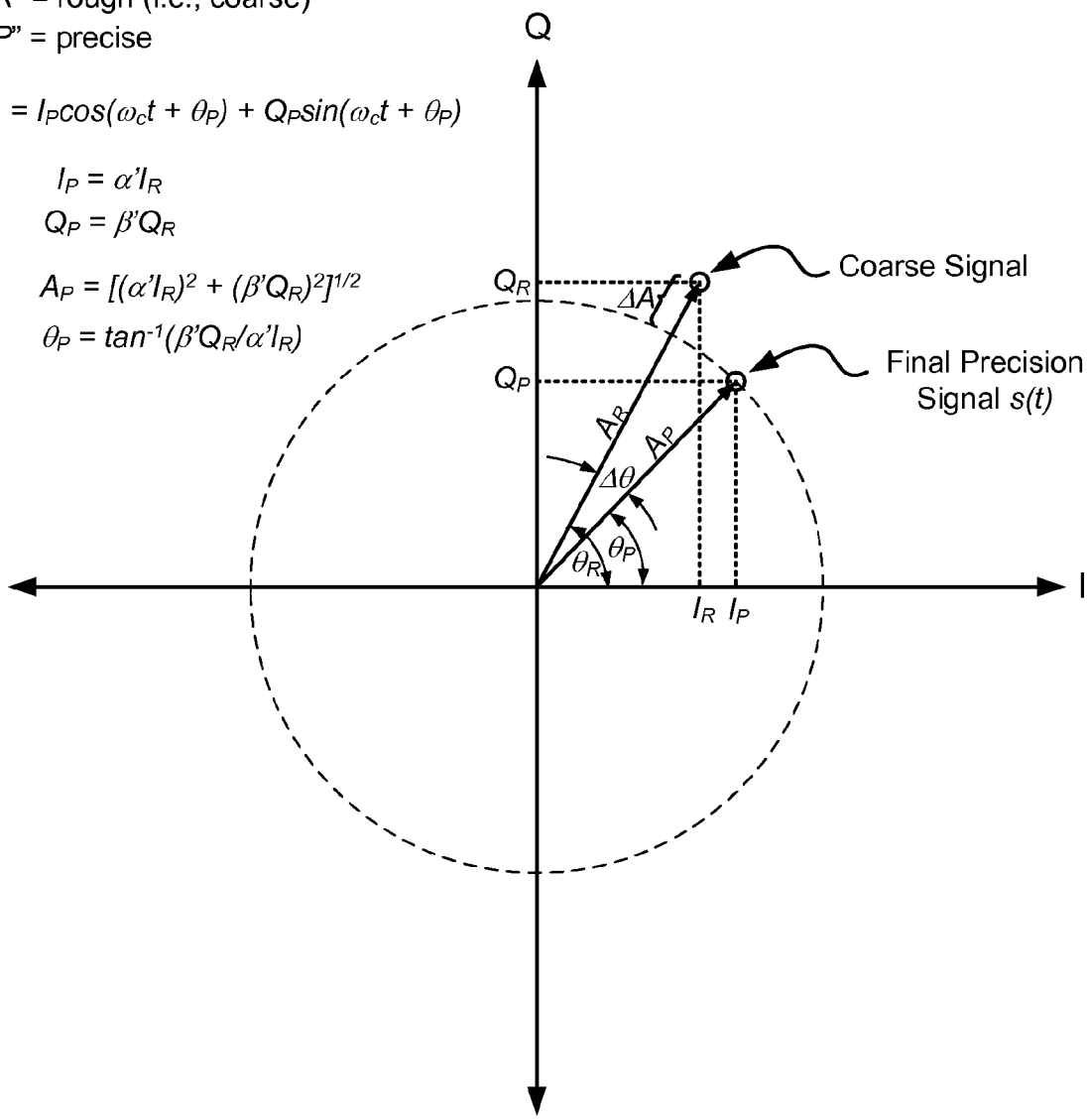
FIG. 8 is a phasor diagram showing the phase relationship between a coarse carrier phase and a precision carrier phase in a circumstance where the coarse carrier phase has a magnitude different from the magnitude of a precision carrier phase.

In the embodiment of the invention described above, it is assumed that the magnitude $A_R$ of the coarse phase-modulated signal $A_R \cos(\omega_c t + \theta_R(t))$ is the same as the magnitude $A_P$ of the final precision modulated signal s(t), i.e., $A_R = A_P = A$ (or that the two magnitudes are negligibly different). However, in some circumstances the difference in magnitudes, i.e., the magnitude error $\Delta A = A_R - A_P$ (see FIG. 8), may not be negligible. The magnitude error $\Delta A$ can be attributable to a variety of factors, including gain and/or phase imbalances in the coarse carrier phases $\theta_1(t), \theta_2(t), \ldots, \theta_K(t)$ produced by the multiphase generator 302, gain and/or phase imbalances caused by less-than-ideal components of the quadrature phase splitter 512, and/or phase and/or gain imbalances in the in-phase and quadrature arms 506 and 510 of the QM 502. To cancel out or reduce the magnitude error $\Delta A$ in situations where it is not negligible, in one embodiment of the invention a pre-operation calibration process is performed. The pre-operation calibration process measures magnitudes and phases of signals at various nodes in the wideband phase modulator 300, compares the measurements to known or desired values, and generates therefrom phase and magnitude adjustment coefficients $\alpha'$ and $\beta'$. Similar to the embodiments of the invention described in reference to FIGS. 5 and 6, the phase and magnitude adjustment coefficients $\alpha'$ and $\beta'$ are configured in a LUT and stored in a memory. During operation, the phase/magnitude adjustment coefficients $\alpha'$ and $\beta'$ are retrieved from the LUT and used to scale the in-phase and quadrature components $I_R(t)$ and $Q_R(t)$ of the coarse phase-modulated signal $A_R \cos(\omega_c t + \theta_R(t))$, thereby not only rotating the coarse phase-modulated signal $A_R \cos(\omega_c t + \theta_R(t))$ to the final and desired precision phase $\theta_P$, as in the embodiments describe in reference to FIGS. 5 and 6 above, but also eliminating or at least substantially reducing the magnitude error $\Delta A$.

It should be mentioned that the required values of the phase adjustment coefficients $\alpha$ and $\beta$ and/or the required values of the phase and magnitude adjustment coefficients $\alpha'$ and $\beta'$ may depend on the carrier frequency $\omega_c$. Accordingly, for embodiments of the invention in which carrier frequency $\omega_c$ is tunable over a range of different frequencies, calibration may be performed for multiple frequencies and multiple frequency-dependent coefficient LUTs may be prepared based on the calibration results. Then, during operation, the appropriate one of the frequency-dependent LUTs is accessed for scaling the in-phase and quadrature components $I_R(t)$ and $Q_R(t)$.

Figure 9:
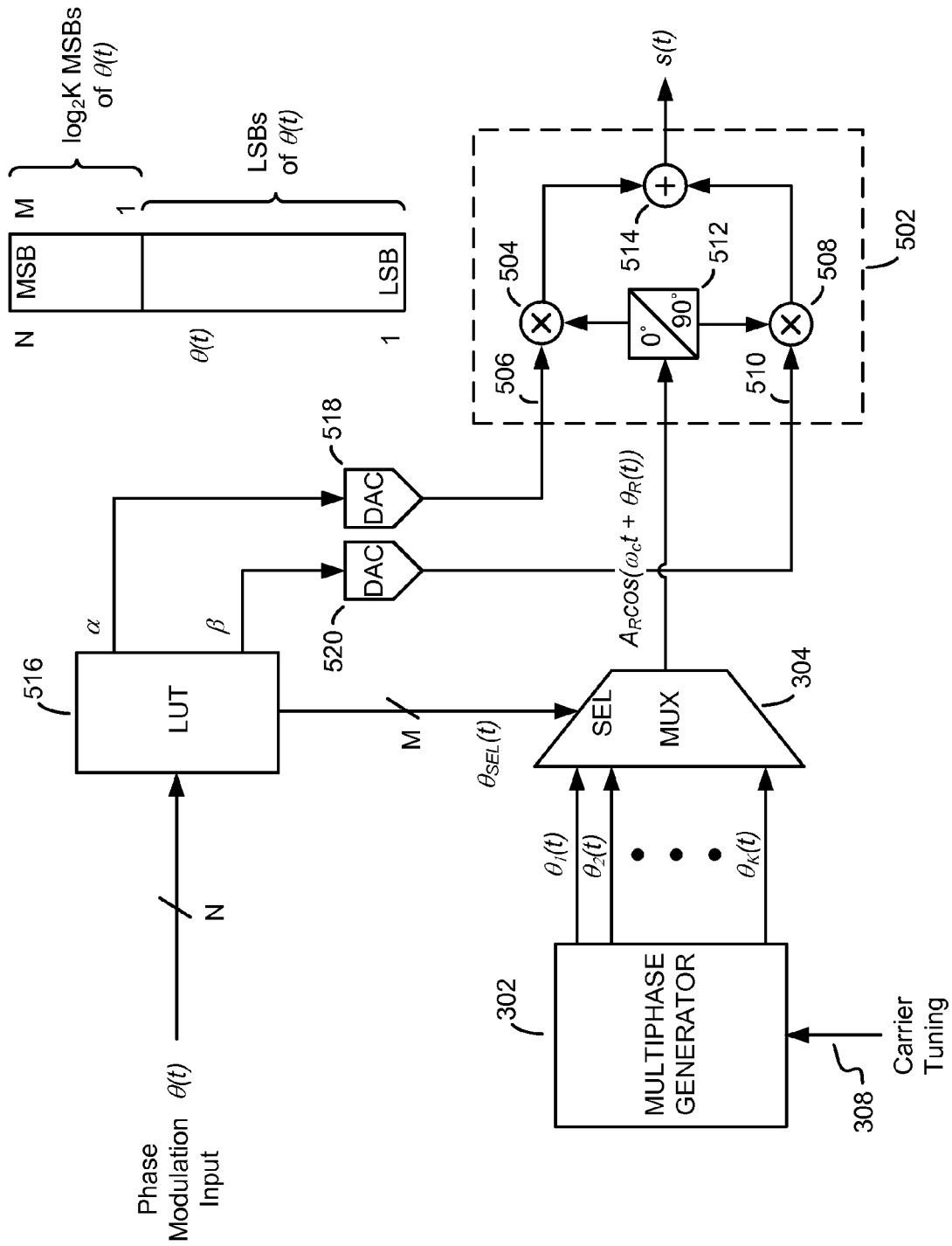
FIG. 9 is a drawing of a wideband phase modulator, similar to the wideband phase modulator shown in FIG. 5, except modified so that the quadrature modulator performs a two-sided fine phase adjustment operation, according to an embodiment of the present invention.

In the exemplary embodiments of the invention described in FIGS. 5 and 6 above, the QM 502 is configured to perform a one-sided phase adjustment operation. However, the QM 502 could be alternatively configured to perform a two-sided phase adjustment, similar to as described above in reference to FIG. 3. FIG. 9 is a drawing illustrating how the wideband phase modulator 500 in FIG. 5 can be modified to support two-sided fine phase adjustment. (The wideband phase modulator 600 in FIG. 6 could be similarly modified.) Note that the need for a dedicated bit translator, such as the bit translator 310 FIG. 3, is obviated by simply arranging the M-bit phase select words in the LUT appropriately.) Other embodiments of the invention could be similarly modified two support two-sided fine phase adjustment, as will be appreciated by those of ordinary skill in the art.

Figure 10:
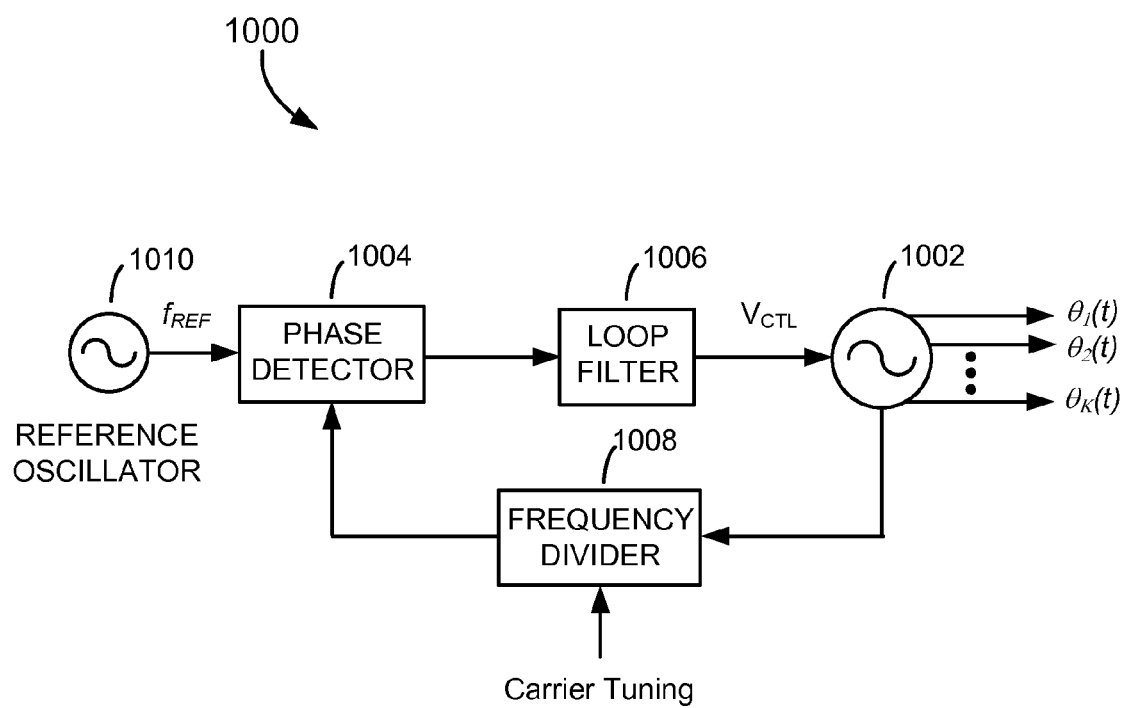
FIG. 10 is a drawing of a multiphase generator that may be used to implement the multiphase generators in the wideband phase modulators of the present invention.

FIG. 10 is a drawing of a multiphase generator 1000 that may be used to implement the multiphase generators 302 of the wideband phase modulators described herein. The multiphase generator 1000 comprises a multiphase controlled oscillator 1002 (e.g., a current, voltage or digitally controlled oscillator) configured within a phase-locked loop (PLL) that also includes a phase detector 1004, loop filter 1006, and an optional frequency divider 1008. The PLL operates to reduce the phase difference between a reference signal of reference $f_{REF}$ provided by a reference oscillator 1010 and one of the output phases of the multiphase controlled oscillator 1002. The optional frequency divider 1008 (e.g., an integer or fractional divider), which is configured in the feedback path of the PLL, is used to divide the frequency of the fed back output phase, thereby providing the ability to tune the carrier frequency $\omega_c$. Coarse phase modulation is performed in cooperation with the phase selector 304 or 604, by selecting from among the K coarse carrier phases $\theta_1(t), \theta_2(t), \ldots \theta_K(t)$ provided by the multiphase controlled oscillator 1002. Which of the K coarse carrier phases is selected is determined by the value of the M-bit phase select words applied to the SEL input of the phase selector 304 (or 604), similar to as explained above.

Figure 11:
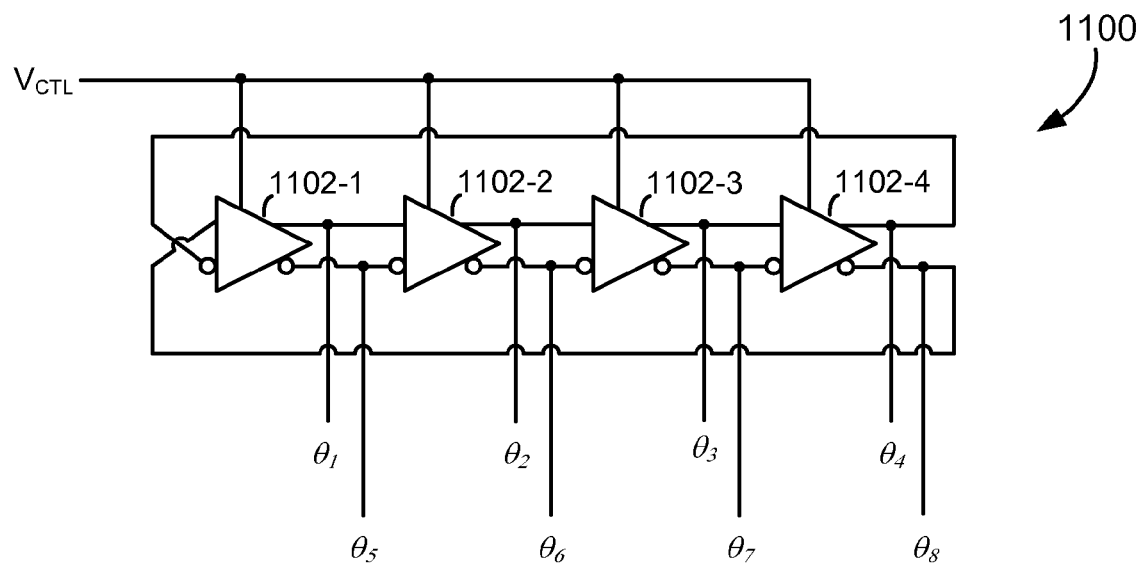
FIG. 11 is a circuit diagram of an eight-phase differential ring oscillator, which may be used to implement the multiphase oscillator of the multiphase generator in FIG. 10.
Figure 12:
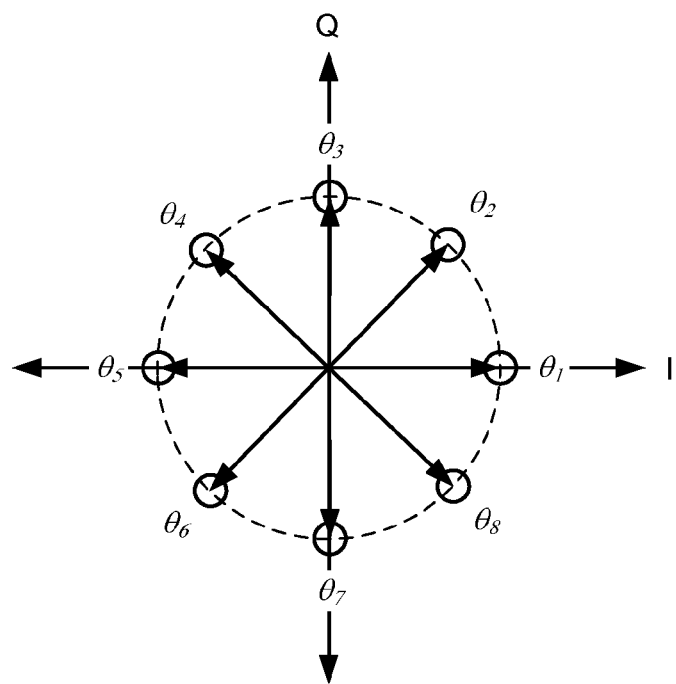
FIG. 12 is a phasor diagram showing the phase relationships among the plurality of coarse carrier phases $\theta_1(t)$, $\theta_2(t)$, . . . , $\theta_8(t)$ generated by the differential ring oscillator in FIG. 11.

In one embodiment of the invention, the controlled oscillator 1002 of the multiphase generator 1000 is implemented as a ring oscillator, a four-stage example of which is shown in FIG. 11. The four-stage ring oscillator 1100 includes four identical differential amplifiers 1102-1, 1102-2, 1102-3 and 1102-4 connected in a ring. The differential output of each differential amplifier is connected to the differential input of the next differential amplifier in the ring, except for the output of the differential amplifier 1102-4 and the input of the differential amplifier 1102-1, which are cross-connected. The oscillating frequency $f_{osc}$ of the ring oscillator 1100 depends on the number of stages in the ring and is given by: $1/(2\pi N_{stage}\tau)$, where $N_{stage}$ is the number of stages and $\tau$ is the signal delay presented by each stage. In one embodiment of the invention, $f_{osc}$ is the same as the carrier frequency, i.e. $f_{osc}=f_c\omega_c/2\pi$. Each of the differential amplifiers 1102-1, 1102-2, 1102-3 and 1102-4 has a differential output, so K=8 different coarse carrier phases $\theta_1(t), \theta_2(t), \ldots, \theta_8(t)$ are available for selection. The phase relationship among the eight phases, $\theta_1(t), \theta_2(t), \ldots, \theta_8(t)$ of the four-stage ring oscillator 1100 is shown in the phasor diagram in FIG. 12. Further details of similar ring oscillators and details of other ring oscillators that may be used or adapted to implement the ring oscillator 1100 in FIG. 11 may be found in B. Razavi, *Design of Analog CMOS Integrated Circuits*, New York, McGraw-Hill, 2001 and R. J. Betancourt-Zamora and T. H. Lee, *Low Phase Noise CMOS Ring Oscillator VCOs for Frequency Synthesis,* 2nd International Workshop on Design of Mixed-Mode Integrated Circuits, Jul. 27-29, 1998, pp. 37-40, both of which are hereby incorporated by reference in their entirety and for all purposes.

Figure 13:
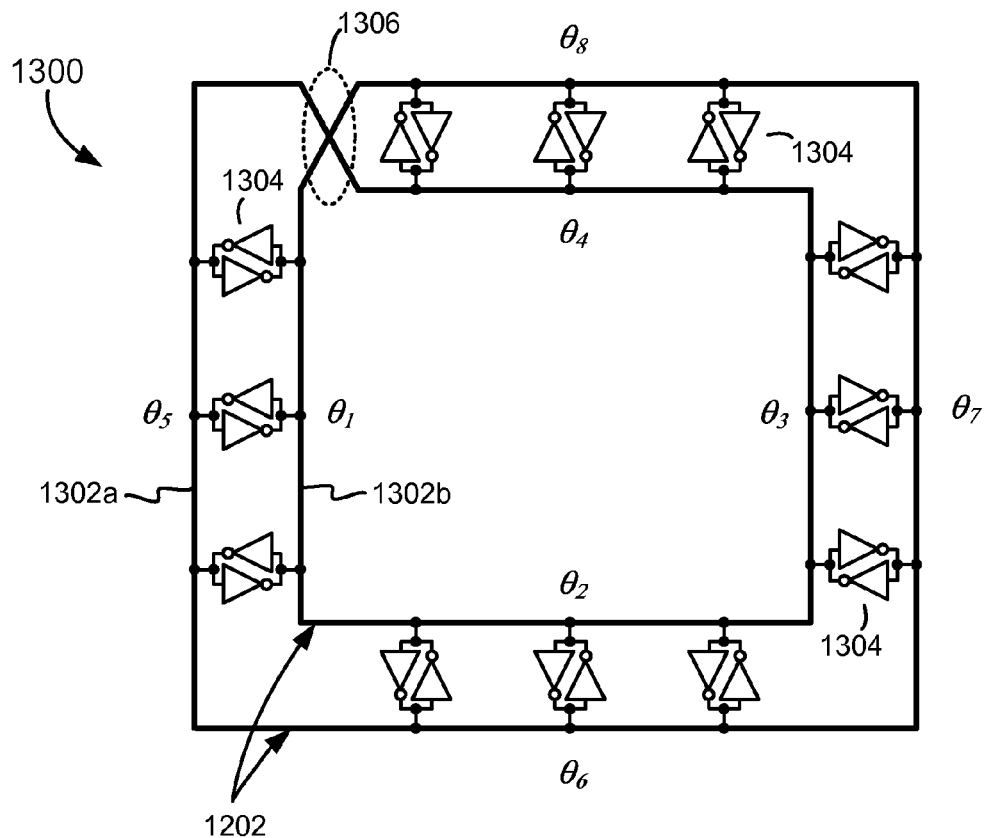
FIG. 13 is a drawing of an eight-phase rotary traveling wave oscillator (RTWO), which may be used to implement the multiphase oscillator of the multiphase generator in FIG. 10.

The differential ring oscillator 1100 described above has four stages. However, it may be alternatively configured to have a greater or lesser number of stages. In theory, it may be configured to have an unlimited number of stages. However, because phase noise increases as more stages are added, in practice only a limited number of stages is usually acceptable. The power consumption of ring oscillators also increases significantly as more stages are added. To overcome these drawbacks, particularly in applications in which the wideband phase modulators of the present invention must operate at very high frequencies, a wave-based oscillator, such as a rotary traveling wave oscillator (RTWO), is used to implement the multiphase modulator 302, in accordance with another embodiment of the invention. FIG. 13 is a drawing showing the salient components of an eight-phase (K=8) RTWO 1300. Note that the RTWO 1300 is shown to have only eight phases, in order to simplify illustration. In an actual implementation, the RTWO 1300 would typically, though not necessarily, be designed and configured to provide a greater number of phases. For example, in one particular embodiment of the invention, an RTWO having K=64 phases is designed and used, thereby providing $\log_2 K$=6 bits of coarse phase modulation resolution.

As shown in FIG. 13, the RTWO 1300 comprises a differential transmission line 1302 and a plurality of regenerative circuits 1304. The differential transmission line 1302 is a physically and electromagnetically endless loop, which can be viewed as being formed from transmission line segments 1302a and 1302b that are generally parallel and cross at a crossover 1306. The differential transmission line 1302 therefore takes the form of a Moebius strip. The regenerative circuits 1304 comprise a plurality of cross-coupled inverters inserted between the transmission line segments 1302a and 1302b. During start-up, when power is first applied to the regenerative circuits 1304, a traveling wave is generated from inherent noise present in the regenerative circuits 1304. As the traveling wave develops, the regenerative circuits 1304 reinforce the traveling wave, thereby sustaining it and countering losses it experiences as it travels along the differential transmission line 1302.

Figure 14:
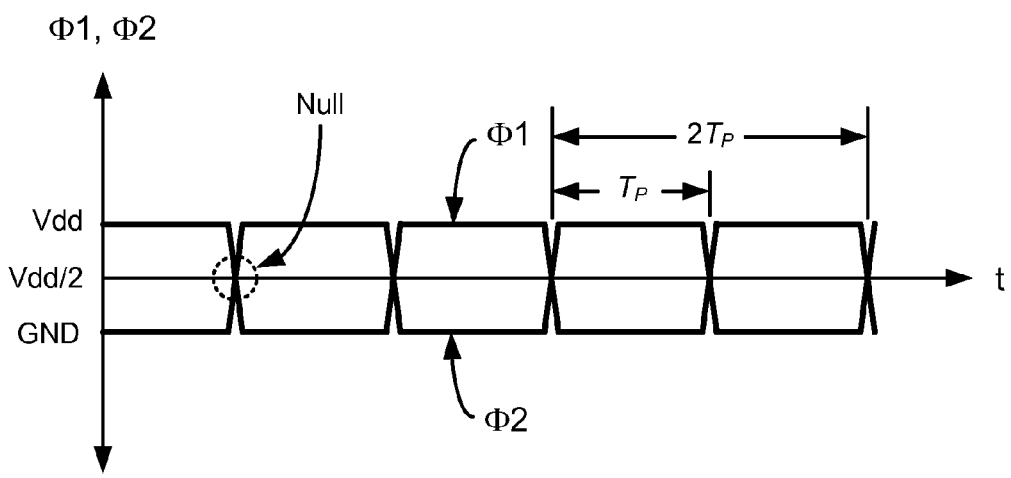
FIG. 14 is a signal diagram showing the oscillation waveforms Φ1 and Φ2 that appear at the input/output terminals of one of the regenerative circuits of the RTWO in FIG. 13, after a traveling wave has been fully established in the RTWO.

FIG. 14 shows the oscillation waveforms $\Phi 1$ and $\Phi 2$ that appear at the input/output terminals of one of the regenerative circuits 1304, after the traveling wave has been fully established. The oscillation waveforms $\Phi 1$ and $\Phi 2$ are substantially square and differential, crossing at a midpoint Vdd/2 of the maximum signal amplitude Vdd. The midpoint Vdd/2 can be considered as a 'null' point since the instant that both oscillation waveforms $\Phi 1$ and $\Phi 2$ are at the same potential, there is no displacement current flow present in nor any differential voltage between transmission line segments 1302a and 1302b. As the RTWO 1300 operates, the null point sweeps around the differential transmission line 1302 at a rate of $1/(2T_p)$, where $T_p$ is equal to the half period of the oscillation waveforms $\Phi 1$ and $\Phi 2$. The sweep rate $1/(2T_p)$ defines the fundamental oscillating frequency $f_{osc}$ of the RTWO 1300, and relates to the physical properties of the RTWO 1300 as follows: $f_{osc}=1/(2T_p)=v_p/(2)$, where $v_p=(L_oC_o)^{-1/2}$ is the phase velocity of the oscillation waveforms $\Phi 1$ and $\Phi 2$ traveling along the transmission line 1302, $L_o$ and $C_o$ are the inductance and capacitance per unit length of the transmission line 1302, and l is the length of the transmission line 1302.

Figure 15:
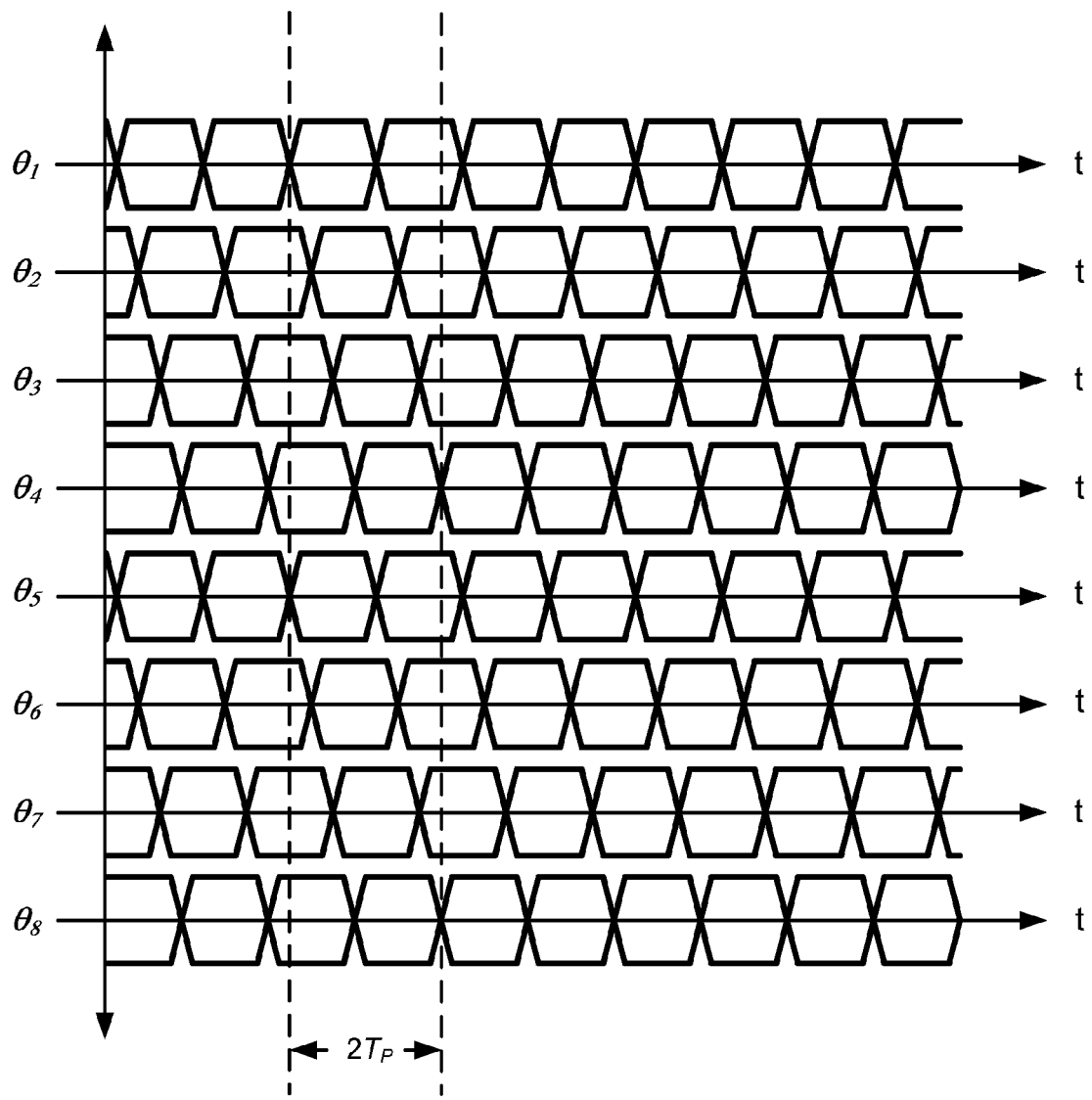
FIG. 15 is a signal diagram showing the phase relationships among the eight coarse carrier phases $\theta_1(t)$, $\theta_2(t)$, . . . , $\theta_8(t)$ generated by the RTWO in FIG. 13.

The oscillation waveforms $\Phi 1$ and $\Phi 2$ at the input/output terminals of a given regenerative circuit 1304 arrive back at the input/output terminals of the same regenerative circuit 1304 after traversing one lap (l/2) of the transmission line 1302, resulting in a 180° phase rotation. A full cycle phase rotation from (i.e., 360° rotation) is completed after the oscillation waveforms $\Phi 1$ and $\Phi 2$ have traversed two laps, i.e., the full length l of the transmission line 1302. The K=8 coarse carrier phases $\theta_1(t), \theta_2(t), \ldots, \theta_8(t)$ are extracted from the RTWO 1302 by taps positioned at equally spaced positions along the transmission line 1302. FIG. 15 is a timing diagram illustrating the phase relationships among the K=8 coarse carrier phases $\theta_1(t), \theta_2(t), \ldots, \theta_8(t)$ at the various taps.

In addition to having the ability to oscillate at a high frequency with low phase noise, the RTWO 1300 has excellent power dissipation characteristics, even at high frequencies. In fact, once a traveling wave is established in the RTWO 1300, little power is required to sustain it. The energy used to switch the regenerative circuits 1304 is part of the wave energy that circulates around the transmission line 1302. Further, when the inverters of the regenerative circuits 1304 are formed using CMOS technology, energy that goes into charging the MOS capacitors of the inverters' transistors becomes transmission line energy that is re-circulated in the closed electromagnetic path. Therefore, losses are not dominated by $CV^2f$ losses, as in other types of oscillators, but by $I^2R$ dissipation in the transmission line signal line trace. Additional details of RTWOs and examples of RTWOs that may be modified or adapted for use in the wideband phase modulators of the present invention may be found in J. Wood et al., *Rotary Traveling-Wave Oscillator Arrays: A New Clock Technology,* IEEE Journal of Solid-Sate Circuits, vol. 36, no. 11, November 2001 and U.S. Pat. Nos. 6,556,089 and 7,218,180 to Wood, all of which are hereby incorporated by reference in their entirety and for all purposes.

Figure 16:
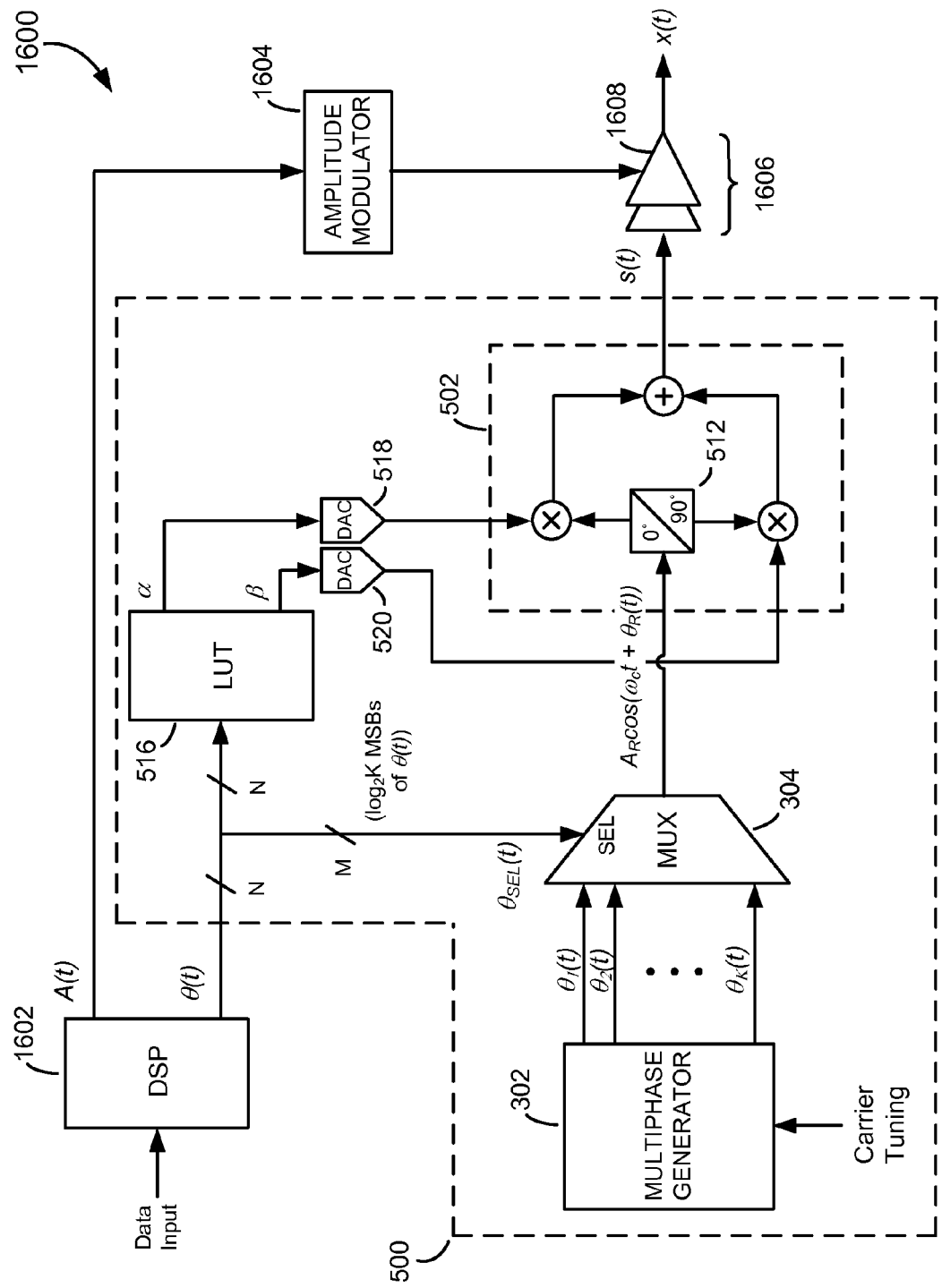
FIG. 16 is a drawing of a polar transmitter configured to use one of the wideband phase modulators of the present invention.

Because of it wideband modulation capability and high modulation accuracy, the wideband phase modulators disclosed herein are particularly well-suited for use in a polar transmitter. FIG. 16 is a drawing of a polar transmitter 1600 configured to employ the wideband phase modulator 500, according to an embodiment of the present invention. As explained below, in general, the polar transmitter 1600 operates to generate a carrier signal x(t) that is modulated in terms of both amplitude and phase.

The wideband phase modulator 500 is employed to perform the phase modulation and is configured in a phase (PM) modulation path of the polar transmitter 1600. Similar to as described above, the wideband phase modulator 500 produces a precision wideband phase-modulated signal s(t) from an N-bit phase-modulating signal θ(t) provided by a digital signal processor (DSP) 1602 or some other external digital circuit. The precision wideband phase-modulated signal s(t) is coupled to the input of an amplifier 1606. (Note that whereas the wideband phase modulator 500 is configured so that the QM 502 performs a one-sided fine phase adjustment operation, it may be alternatively configured to perform a two-side fine phase adjustment operation, similar to as described above. Further, the phase selector 304 can be alternatively replaced with a differential phase selector 604, as in FIG. 6, thereby obviating the need for the quadrature phase splitter 512 in the QM 502.)

As the precision wideband phase-modulated signal s(t) is being formed by the wideband phase modulator 500 in the PM path, an amplitude modulator 1604 in an amplitude modulation (AM) path of the polar transmitter 1600 generates an amplitude-modulated power supply signal from an amplitude-modulating signal A(t) provided by the DSP 1602. The amplitude-modulated power supply signal has an amplitude that tracks the amplitude of the amplitude-modulating signal A(t), and once generated is coupled to the power supply port of an output stage 1608 of the amplifier 1606. The output stage 1608 comprises a switch-mode power amplifier, such as a Class D or E switch-mode power amplifier, which is configured to switch between compressed and cut-off states in response to the precision wideband phase-modulated signal s(t) provided by the wideband phase modulator 500. The switch-mode output stage power amplifier 1608 has an output power that is dependent upon amplitude changes in the power supply applied to its power supply port. Accordingly, as the precision wideband phase-modulated signal s(t) is amplified by the amplifier 1606, the amplitude-modulated power supply signal modulates the power supply port of the switch-mode PA output stage 1608, resulting in the desired final amplitude- and phase-modulated signal x(t) appearing at the output of the amplifier 1606. The final amplitude- and phase-modulated signal x(t) may then be coupled to an antenna (not shown) and radiated or broadcast over the air to a remote receiver (e.g., a base station, wireless router, or wireless access point).

While various exemplary and preferred embodiments of the present invention have been described, it will be apparent to those of ordinary skill in the art, upon review of this disclosure, that various changes in form and detail may be made to the invention without departing from the true spirit and scope of the invention. The scope of the invention should therefore not be determined with reference to the above description but, instead, should be determined with reference to the appended claims, along with the full scope of equivalents to which such claims are entitled.

What is claimed is:

1. A wideband phase modulator, comprising:
   a multiphase generator configured to generate a plurality of coarse carrier phases;
   a phase selector configured to select from among said plurality of coarse carrier phases; and
   a phase adjuster configured to adjust the phase of a selected coarse carrier phase from a coarse phase to a precision phase by interpolating between a selected coarse carrier phase and an adjacent coarse carrier phase or by adjusting around a selected coarse carrier phase,
   wherein the coarse carrier phases generated by said multiphase generator are generated without modulating an oscillator in a phase-locked loop by an information-bearing phase-modulating signal.

2. The wideband phase modulator of claim 1, wherein said phase adjuster is configured to adjust the phase of said selected coarse carrier phase without using feedback.

3. The wideband phase modulator of claim 1, wherein said multiphase generator comprises a wave-based oscillator.

4. The wideband phase modulator of claim 1, wherein said phase adjuster comprises a quadrature modulator.

5. The wideband phase modulator of claim 4, wherein said multiphase generator and said phase selector together serve as a local oscillator for said quadrature modulator.

6. A method of modulating the phase of a carrier signal, comprising:
   generating a plurality of coarse carrier phases, all having the same frequency but each being offset in phase relative to the others;
   selecting from among said plurality of coarse carrier phases to produce a selected coarse carrier phase; and
   finely adjusting the phase of said selected coarse carrier phase to produce a final precision carrier phase,
   wherein generating said plurality of coarse carrier phases is performed without modulating an oscillator in a phase-locked loop by an information-bearing phase-modulating signal, and wherein finely adjusting the phase of said selected coarse carrier phases comprises interpolating between said selected coarse carrier phase and an adjacent coarse carrier phase or adjusting around said selected coarse carrier phase.

7. The method of claim 6, wherein finely adjusting the phase of said selected coarse carrier phase to produce said final precision carrier phase is performed without using feedback.

8. The method of claim 6, wherein finely adjusting the phase of said selected coarse carrier phase to produce said final precision phase is performed using a quadrature modulator.

9. The method of claim 6, wherein generating said plurality of coarse carrier phases is performed by a wave-based oscillator.

10. A polar transmitter, comprising:
    an amplitude modulator configured to generate an amplitude-modulated power supply signal from an input amplitude-modulating signal;
    an open-loop wideband phase modulator configured to generate a phase-modulated carrier signal from an input phase-modulating signal, said open-loop wideband phase modulator including a multiphase generator configured to generate a plurality of coarse carrier phases without modulating an oscillator in a phase-locked loop by an information-bearing phase-modulating signal, a phase selector configured to select from among said plurality of coarse carrier phases; and a phase adjuster configured to adjust the phase of a selected coarse carrier phase from a coarse phase to a precision phase by interpolating between a selected coarse carrier phase and an adjacent coarse carrier phase or by adjusting around a selected coarse carrier phase; and an amplifier having an input port configured to receive said phase-modulated carrier signal and a switch-mode power amplifier output stage having a power supply port configured to receive said amplitude-modulated power supply signal.

11. The polar transmitter of claim 10, wherein the phase adjuster of said open-loop wideband phase modulator is configured to adjust the phase of said selected coarse carrier phase without using feedback.

12. The polar transmitter of claim 10, wherein the multiphase generator of said open-loop wideband phase modulator comprises a wave-based oscillator.

13. The polar transmitter of claim 10, wherein the phase adjuster of said open-loop wideband phase modulator comprises a quadrature modulator.

14. The polar transmitter of claim 13, wherein the multiphase generator and the phase selector of said open-loop wideband phase modulator together serve as a local oscillator for said quadrature modulator.

* * * * *